United States Patent [19]

Flükiger et al.

[11] Patent Number: 4,933,139

[45] Date of Patent: Jun. 12, 1990

[54] PROCESS FOR THE PRODUCTION OF $PB_xMO_yS_z$ CHEVREL-PHASE COMPOUNDS

[75] Inventors: Rene Flükiger, Karlsruhe; Wilfried Goldacker, Heidelberg, both of Fed. Rep. of Germany

[73] Assignee: Kernforschungszentrum Karlsruhe GmbH, Karlsruhe, Fed. Rep. of Germany

[21] Appl. No.: 91,771

[22] Filed: Sep. 1, 1987

[30] Foreign Application Priority Data

Sep. 1, 1986 [EP] European Pat. Off. ........ 86112040.0

[51] Int. Cl.$^5$ .............................................. B22F 3/00
[52] U.S. Cl. .................................... 419/10; 29/599; 264/125; 419/25; 419/49; 505/823
[58] Field of Search ............... 264/56, 60, 61, 65, 264/85, 109, 125; 29/599; 419/8, 10, 49, 25; 505/1, 813, 822; 148/11.5 P, 11.5 Q

[56] References Cited

U.S. PATENT DOCUMENTS

| | | | |
|---|---|---|---|
| 4,006,107 | 2/1977 | Foner et al. | 505/807 X |
| 4,411,959 | 10/1983 | Braginski et al. | 505/813 X |
| 4,419,125 | 12/1983 | Charles et al. | 29/599 |
| 4,564,501 | 1/1986 | Goldstein | 419/25 |
| 4,575,927 | 3/1986 | Braginski et al. | 29/599 |
| 4,594,218 | 6/1986 | Dubots et al. | 419/4 |
| 4,704,249 | 1/1987 | Glatzle | 419/4 |

FOREIGN PATENT DOCUMENTS 0181496 5/1986 European Pat. Off. .

OTHER PUBLICATIONS

Cattani, D. et al, "Critical Current Densities of Superconducting $PbMo_6S_8$...", 9th Intn'l. Conf. on Magnet Tech., MT-9 (1985), pp. 560-563.

Kubo, Y. et al, "Properties at High Fields in $PbMo_6S_8$ Superconducting Wires", Intn'l. Cryogenic Materials Conference, 8/85 (to be published in Adv. Cryo. Eng., vol. 32 (1986)).

Seeber, B. et al, "Investigation of the Properties of $PbMo_6S_8$ Powdered Processed Wires", IEEE Trans. on Magnetics, vol. MAG-19, No. 3, May 1983.

Hinks, D. G. et al., "Oxygen Impurity in the Chevrel--Phase $SnMo_6S_8$", *Solid State Communications*, vol. 49, No. 1, pp. 51-54 (1984).

*Primary Examiner*—Jan H. Silbaugh
*Assistant Examiner*—Mary Lynn Fertig
*Attorney, Agent, or Firm*—Spencer & Frank

[57] ABSTRACT

A process for the production of at least a one kilogram block of Chevrel-phase $Pb_xMo_yS_z$, wherein $x=0.9$ to 1.2, $y=6.0$ to 6.4, and $z=7$ to 8, includes mixing thoroughly stoichiometric quantities of starting materials in powdered form. The starting materials are selected from elemental Pb, Mo and S, sulfides of elemental Pb and Mo, and mixtures thereof. The starting mixture is introduced into a metallic container and evacuated to a pressure to $10^4$ Pa or less. The evacuated container is subjected to hot isostatic pressing at a constant pressure selected from a pressure ranging from 100 to 300 MPa, at a heating rate ranging from 10° to 100° C./hr., at a final pressing temperature ranging from 800° to 1200° C., and for a pressing period ranging from 10 to 100 hours, whereby the starting materials react to form the block of Chevrel-phase $Pb_xMo_yS_z$. The block is cooled at a cooling rate ranging from 50° to 500° C./hr. while maintaining the constant pressure. The process may include the further steps of filling the metallic container after evacuation with an inert gas; re-evacuating the metallic container to remove the inert gas; and heating the metallic container after re-evacuation at a temperature ranging up to but less than 300°, prior to subjecting the metallic container to hot isostatic pressing.

2 Claims, No Drawings

PROCESS FOR THE PRODUCTION OF $Pb_xMo_yS_z$ CHEVREL-PHASE COMPOUNDS

BACKGROUND OF THE INVENTION

1. Field of the Invention

The invention relates to a process for the production of $Pb_xMo_yS_z$ Chevrel-phase compounds, wherein $x=0.9$ to $1.2$, $y=6.0$ to $6.4$, and $z=7$ to $8$, and more particularly to a process for the production of large blocks of $Pb_xMo_yS_z$ Chevrel-phase compounds including the steps of subjecting blended powders of these elements and/or of the corresponding metal sulfides to hot isostatic pressing at a temperature ranging from 800° C to 1200° C and a pressure in excess of 10 MPa (>100 bar).

2. Description of the Related Art

Production of superconducting wires from ternary superconducting phases, for example, in the form of metal-Mo-chalcogenides, i.e., so-called Chevrel-phase compounds, has been proposed from samples of $Pb_xMo_yS_z$ (hereinafter referred to as PMS) prepared either from pre-reacted powders or from a mixture of powders of Mo, $MoS_2$, and PbS by a hot pressing technique (D. Cattani et al., 9th International Conference on Magnet Technology, Zuerich, Switzerland, Sept. 9-13th, 1985, issue MT-9 1985, pages 560-563). Optimal conditions for hot pressing were reported to be a temperature of 1100° C, a duration of one hour, and a pressure of 240 MPa. These conditions were expected to produce homogeneous and dense PMS samples with a grain size of about 1 micrometer and a density of greater than 96 % of the theoretical density. Small amounts of gallium and gallium arsenide, respectively, were added to the ternary phase in order to improve the superconducting parameters of the PMS. PMS wires of several hundred meters in length were produced using, as a matrix for the PMS wires, a combination of a steel jacket and a molybdenum jacket for which the thermal expansion of the matrix matches that of the PMS and which reduces the typically occurring decline of critical current density measured for PMS samples The Cattani et al. publication mentions, however, that use of a mixture of powders of PbS, $MoS_2$, and Mo under the previously mentioned optimal conditions or even at a hot pressing temperature of 1500° C, did not achieve a complete reaction of the materials to PMS. Cattani et al. used a modified, hydraulic, uniaxial press in which they heated the pre-reacted powders and the powder mixture, respectively, up to the desired temperature. A further disadvantage of the reference's method lies in the fact that uniform density can not be achieved with quantities of powder larger than that necessary for the production of small individual pellets. Uniform density of substantially larger blocks of PMS, however, is an absolute requirement for the production of a superconducting wire that has good superconducting properties.

Seeber et al., *IEEE Trans. Mag.*, MAG-19, page 402 (1983) describes a process which includes a subsequent annealing at temperatures around 1000° C to recover the original superconducting properties of the PMS phase.

In another process (Y. Kubo et al., International Cryogenic Materials Conference, August, 1985, Boston, U.S.A.; to be published in *Adv. Cryo. Eng.*, Vol 32 (1986), a mixture of powders of Mo, Pb, and $MoS_2$ was hydrostatically pressed into pellets (cold pressing), after which the pellets were introduced into a tantalum pipe. The tantalum pipe was then introduced into a stabilizing copper pipe and the whole arrangement was drawn into a wire with a diameter of 1.05 mm at room temperature. As a barrier against undesirable behavior by sulfur (sulfur sealing), molybdenum, niobium, and silver were proposed in addition to tantalum, however, tantalum was selected because it has excellent cold working properties. The wire in its final dimensions was then heat-treated for two hours at 1000° C to obtain a PMS Chevrel-phase. For such a concluding heat-treatment, hot isostatic pressing (HIP) at a pressure ranging from 100 to 200 MPa and a temperature ranging from 850 to 1050° C were proposed for a duration of from one to four hours.

In these latters two processes, grain growth occurs, but the disadvantages of grain growth can be limited by keeping the final dimensions of the PMS filaments 1 micrometer or less. Further, molybdenum has poor deformation properties, such that homogeneous distribution of this element was not achieved in the filaments. This has deleterious effects on the critical current density of a long wire.

The most import representative of Chevrel-phase compounds is $PbMo_6S_8$, which is of the utmost technical interest as having the highest known critical magnetic field of ca. 60 Tesla and which is anticipated to be of paramount importance as a future superconductor for the production of the highest fields. All previously known processes for the production of Chevrel-phase compounds, however, have been only feasible on a laboratory scale, i.e., for starting material quantities of around 100 g, and have had only moderate success. Economical translation of these laboratory processes into production scale processes face several obstacles, including production problems during the deformation of a cylindrical block or pipe filled with Chevrel phase $Pb_xMo_yS_z$ into a multifilament wire, degradation of the superconducting properties as a consequence of the mechanical deformation, and increasing energy requirements for scaling up to increased quantities of starting materials. Improvement of a multifilament superconductor includes increasing the number of filaments, reducing the final diameter of the filaments, and developing a matrix which stabilizes the critical current density. In addition, grain size in the filaments has to be reduced to increase the current-carrying capacity of the filaments.

Further, during the treatment of increasing quantities of starting materials, a high density of the Chevrel-phase blocks, an even, predominantly uniphasic composition, and a uniform density throughout the blocks are no longer guaranteed.

SUMMARY OF THE INVENTION

The present invention has as its object development of a process for the production of predominantly uniphasic, kilogram blocks of Chevrel-phase $Pb_xMo_yS_z$, wherein $x=0.9$ to $1.2$, $y=6.0$ to $6.4$, and $z=7$ to $8$, which blocks have a high density of at least 90% of the theoretical density, are homogeneous, are free of gas bubbles, and have no density gradient.

This object is achieved by a process for the production of at least a one kilogram block of Chevrel-phase $Pb_xMo_yS_z$, wherein $x=0.9$ to $1.2$, $y=6.0$ to $6.4$, and $z=7$ to $8$, the process including mixing thoroughly appropriate quantities of starting materials as indicated by the subscripts x, y and z in powdered form sufficient to provide a block of at least one kilogram of Chevrel-phase $Pb_xMo_yS_z$, the starting materials being selected from elemental Pb, Mo and S, sulfides of elemental Pb and Mo and mixtures thereof. The starting materials are introduced after mixing into a metallic container and the metallic container with starting materials contained therein is evacuated to a pressure of $10_4$ Pa or less. The metallic container after evacuation is subjected to hot isostatic pressing at a constant pressure selected from a pressure ranging from 100 to 300 MPa, at a heating rate ranging from 10° to 100° C/hr, at a final pressing temperature ranging from 800° to 1200° C, and for a pressing period ranging from 10 to 100 hours, whereby the starting materials react to form the block of Chevrel-phase $Pb_xMo_yS_z$. The block is cooled at a cooling rate ranging from 50° to 500° C/hr while maintaining the constant pressure.

An advantageous variation to the process according to the invention includes the further steps of filling the metallic container after evacuation with an inert gas; re-evacuating the metallic container to remove the inert gas; and heating the metallic container after re-evacuation at a temperature ranging up to but less than 300° C, prior to subjecting the metallic container to hot isostatic pressing.

The process according to the invention achieves a complete reactive transformation of the starting materials to $Pb_xMo_yS_z$ Chevrel-phase compounds in one procedure. A high, uniform compaction of the reaction product is obtained. The product's grain size in the resulting block plays practically no role in the further processing of the block into multifilament wires. This is because the conversion factor from the block dimensions to the final dimensions of the filaments is several orders of magnitude higher than the conversion factor in other known processes.

The metallic container can have any suitable shape and may be, for example, a pipe or elongate capsule. The container can be composed of a material that can serve as a barrier for the Chevrel-phase compounds or a material that can easily be worked into wires and is coated on the inside by a barrier material.

Suitable materials for the metallic container are metals or alloys, which are ductile at the hot isostatic pressing temperature, such as stainless steel, copper or IN-CONEL. Suitable barrier materials are molybdenum, tantalum or niobium used as a metallic foil or a metallic tube.

European Published Patent Application No. 0 181 496 $A_1$ relates to production of a superconducting wire using a metal-molybdenum chalcogenide (a Chevrel-phase) compound in the superconducting phase, especially $PbMo_6S_8$. The superconducting phase or the starting materials for such a phase are placed in a vacuum-tight molybdenum jacket and, advantageously, in a steel jacket, and this unit is subsequently worked into a superconducting wire by heat transforming of the unit in several process steps. The superconducting phase either is not compacted before the extrusion and/or hot pulling, etc., or the powder-like superconducting phase is compacted by cold isostatic pressing before introducing the material into the molybdenum jacket.

The reference's process has the following disadvantages. The production procedure is complicated, time-consuming, and leads to products that do not show optimal density even prior to the start of wire production. Furthermore, whether compacted by cold pressing or not, a powder-like superconducting phase, i.e., Chevrel-phase compounds, must be available for introduction into the molybdenum jacket. Thus, the Chevrel phase compounds have to be produced in a separate production step and the resulting product has to be worked into a powder.

DESCRIPTION OF THE PREFERRED EMBODIMENTS

In the present invention, the powdery starting materials, for example, for a $PbMo_6S_8$ Chevrel-phase compound, are Pb, PbS, $MoS_2$ and Mo, and are mixed thoroughly with each other in appropriate proportions of ingredients to yield the desired Chevrel phase composition as indicated by the subscripts x, y and z. Thereafter, the starting materials are loaded into a vacuum-tight capsule, the capsule is tapped or knocked to reduce the volume of the powder, and the starting materials are welded in. The capsule is made of, for example, VA steel or other suitable materials, and has a vacuum nipple. The loading and welding can be done in an atmosphere of rare gas, such as helium or argon, to minimize introduction of oxygen. The inner wall of the capsule, which is in contact with the powder, is covered with a foil of a material that does not react with the powder, such as Mo or Ta.

The loaded capsule is evacuated and, after evacuation, the capsule is rinsed by filling the capsule with an inert or rare gas, such as nitrogen or argon, followed by re-evacuation, and heating at moderate temperatures below 300° C, preferably from 100 to 200° C. This technique purges oxygen, moisture, etc. from the loaded capsule. Then the vacuum nipple of the evacuated capsule is welded shut, such as by electron-beam welding, and the capsule is now prepared for the HIP cycle.

Customarily used hot isostatic pressing techniques are useful for practicing the invention.

Hot isostatic pressing (HIP) is conducted at a pressure on the order of 100 MPa and the temperature is brought up to the reaction temperature for the Chevrel-phase $PbMo_6S_8$ of from 1000° C to 1100° C. Depending on the volume and geometry of the loaded capsule reaction times are selected to range between 10 and 30 hours. By applying external pressure on the capsule, the process according to the invention avoids the prior art problems of bursting and explosion, respectively, of the container during the reaction of the powders to form Chevrel-phase compounds. Thus, treatment of large amounts, i.e, one or more kilograms, of powder is permitted and special precautions during the heating process are unnecessary.

The simultaneous formative reaction and hydrostatic compression of the $PbMo_6S_8$ into a firm block, which can be worked by cutting, makes it possible to bring the block to the first deformation step, e.g., extrusion, directly after introduction thereof into a matrix. The geometry of the HIP capsule can, upon consideration of the desired degree of compression, be adapted in any way to the desired form of the $PbMo_6S_8$ block, for the purpose of minimizing the loss of material during further processing.

The cooling rate of the HIP cycle ranges from 50° to 500° C/hr and is controllably adjusted dependent on the nature HIP capsule in order to maintain the integrity of the capsule by avoiding thermally caused cracks and fractures.

Another advantage of the process according to the invention is the possibility of lining the capsule with a matrix material, such as a sheet of steel, and pressing the matrix material around the $PbMo_6S_8$ volume during the HIP process for the subsequent deformation process to produce wire. This can be done either in the same HIP cycle as used to reactively produce the $PbMo_6S_8$ Chevrel-phase or in a substantially faster second HIP cycle, and results in the best possible "bonding" between matrix and the $PbMo_6S_8$ Chevrel phase.

The process according to the invention can be carried out as follows:

The starting material composition is attained by thoroughly mixing the powdery starting materials Pb, $MoS_2$ and Mo with molar ratios of 1:4:2 to yield 2 kg of the Chevrel phase compound $PbMo_6S_8$. The mixed starting materials were filed into a cylindrical stainless steel capsule lines with a 0.5 mm thick molybdenum foil and provided with a vacuum nipple. After tapping or knocking the capsule to reduce the volume of the powder, the capsule is welded in an argon gas atmosphere. By aid of the vacuum nipple, the capsule is evacuated to a pressure of $10^4$ Pa. After rinsing with argon and re-evacuating, the capsule is heated at a temperature of 200° C during a period of 10 hours. Maintaining the vacuum in the capsule, the vacuum nipple is welded shut by electron-beam welding. Hot isostatic pressing (HIP) is conducted at a temperature of 1100° C and a pressure of 100 MPa during a period of 24 hours. The heating rate is 100° C/hr.

The HIP-cycle is discontinued by controlled cooling at a cooling rate of 50° C/hr. The block produced in this way shows a Chevrel phase amount of more than 80% and a density of more than 99% of the theoretically attainable density. No porosity could be detected. The critical superconducting temperature of this product is $T_c = 13{,}5$ K with a transition width of 0,12 K. The critical superconducting electric current density, measured at a temperature of 4,2 K, is $J_c = 10^5$ A/cm$^2$.

The present disclosure relates to the subject matter disclosed in European Patent Application No. 86112040.0, filed Sept. 1st, 1986, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A process for the production of at least a one kilogram block of Chevrel-phase $Pb_xMo_yS_z$, wherein $x = 0.9$ to 1.2, $y = 6.0$ to 6.4, and $z = 7$ to 8, the process comprising:
   a. mixing thoroughly stoichiometric quantities of starting materials in powdered form sufficient to provide a block of at least one kilogram of Chevrel-phase $Pb_xmo_yS_z$, the starting materials being selected from elemental Pb, Mo and S, sulfides of elemental Pb and Mo, and mixtures thereof;
   b. introducing the starting materials after mixing in step a into a metallic container;
   c. evacuating the metallic container with starting materials contained therein to a pressure of $10^4$ Pa or less;
   d. subjecting the metallic container after evacuation to hot isostatic pressing at a constant pressure selected from a pressure ranging from 100 to 300 MPa, at a heating rate ranging from 10° to 100° C/hr, at a final pressing temperature ranging from 10 to 100 hours, whereby the starting materials in powdered form react and form the block of Chevrel-phase $Pb_xMo_yS_z$; and
   e. cooling the block at a cooling rate ranging from 50° to 500° C/hr while maintaining the constant pressure.

2. The process according to claim 1, including the further steps of filling the metallic container after evacuation with an inert gas; re-evacuating the metallic container to remove the inert gas; and heating the metallic container after re-evacuation at a temperature ranging up to but less than 300° C, prior to subjecting the metallic container to hot isostatic pressing.

* * * * *